(12) United States Patent
Satomi

(10) Patent No.: US 7,787,318 B2
(45) Date of Patent: Aug. 31, 2010

(54) SEMICONDUCTOR MEMORY DEVICE HAVING READ OPERATION TESTING FUNCTION

(75) Inventor: Katsuji Satomi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/510,722

(22) Filed: Aug. 28, 2006

(65) Prior Publication Data

US 2007/0047348 A1    Mar. 1, 2007

(30) Foreign Application Priority Data

Aug. 30, 2005    (JP)    ............... 2005-249884

(51) Int. Cl.
*G11C 29/00*    (2006.01)
*G11C 7/00*    (2006.01)

(52) U.S. Cl. .................. 365/201; 365/200; 365/154; 365/156

(58) Field of Classification Search ................ 365/201, 365/156, 154, 200

See application file for complete search history.

(56) References Cited

U.S. PATENT DOCUMENTS

| | | | |
|---|---|---|---|
| 5,023,840 A | 6/1991 | Tobita | |
| 5,548,596 A | 8/1996 | Tobita | |
| 5,808,950 A * | 9/1998 | Suzuki | 365/203 |
| 7,006,396 B2 * | 2/2006 | Kodama | 365/203 |
| 7,232,696 B2 * | 6/2007 | Lee | 438/17 |
| 2004/0245566 A1 | 12/2004 | Lee | |
| 2004/0246772 A1 * | 12/2004 | Lee | 365/154 |
| 2005/0146924 A1 | 7/2005 | Lee | |

FOREIGN PATENT DOCUMENTS

JP    2-206087    8/1990

* cited by examiner

*Primary Examiner*—Hoai V Ho
*Assistant Examiner*—Kretelia Graham
(74) *Attorney, Agent, or Firm*—McDermott Will & Emery LLP

(57) ABSTRACT

A semiconductor memory device is provided which can reliably detect a memory cell which has an unstable operation due to a small memory cell current. A bit line drive circuit is provided with respect to each pair of first and second bit lines, and has a configuration which can decrease a potential of a selected one of the pair of first and second bit lines. During a test operation, the first bit line in conduction with an H-side memory holding node of a memory cell is grounded for a predetermined time, thereby reducing a potential difference between the pair of first and second bit lines.

9 Claims, 13 Drawing Sheets

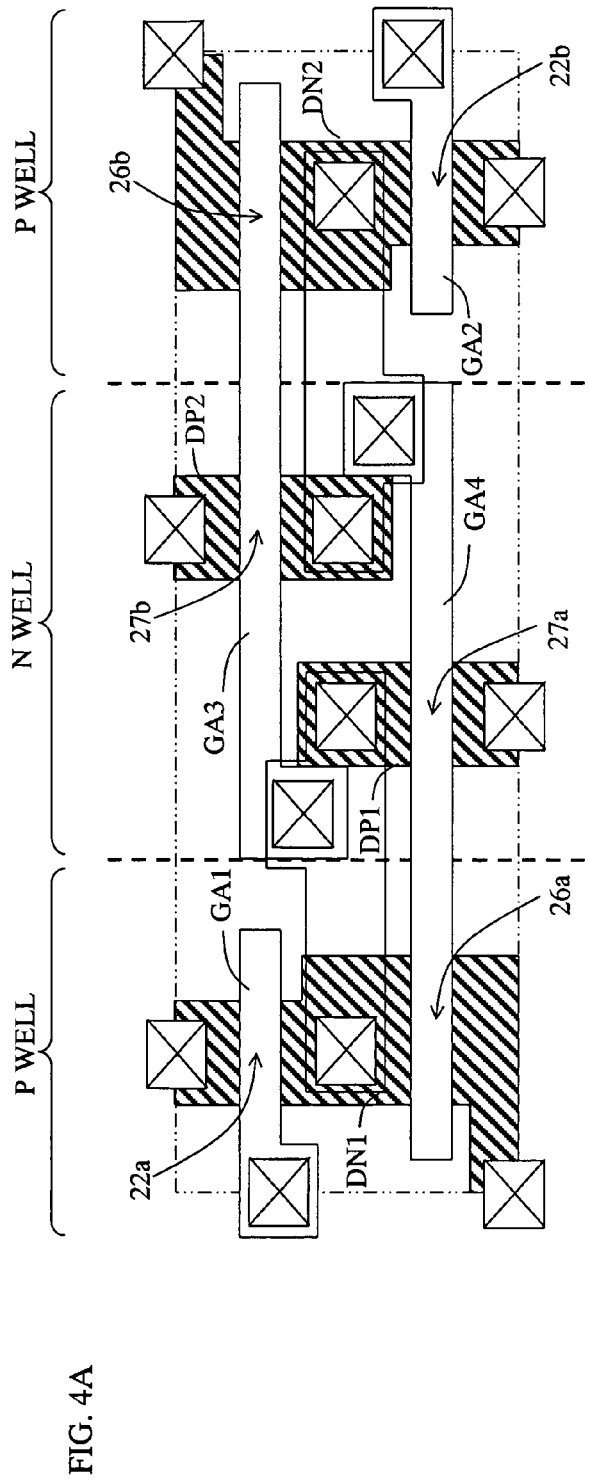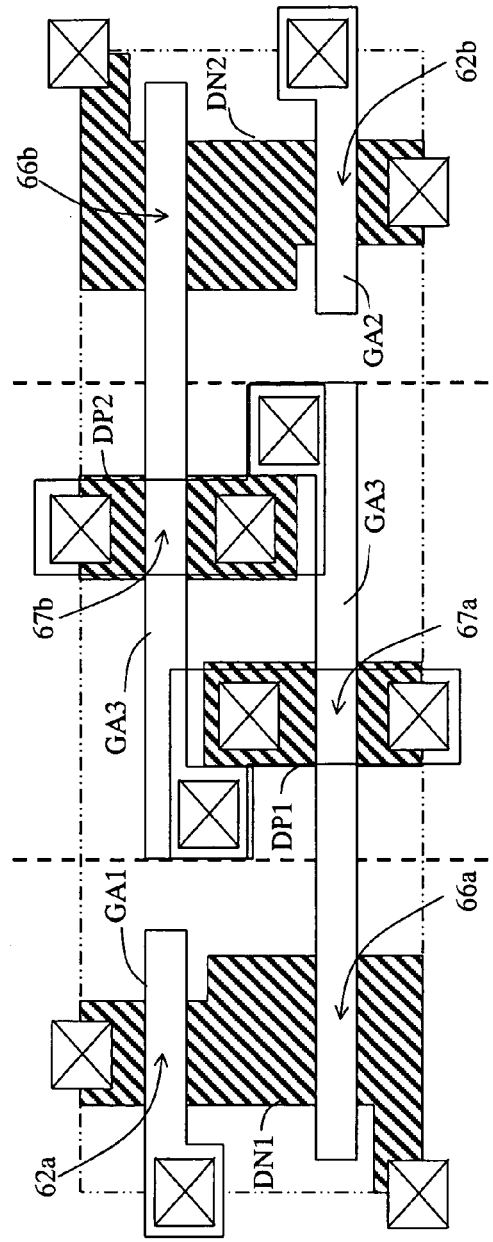
FIG. 4A
FIG. 4B

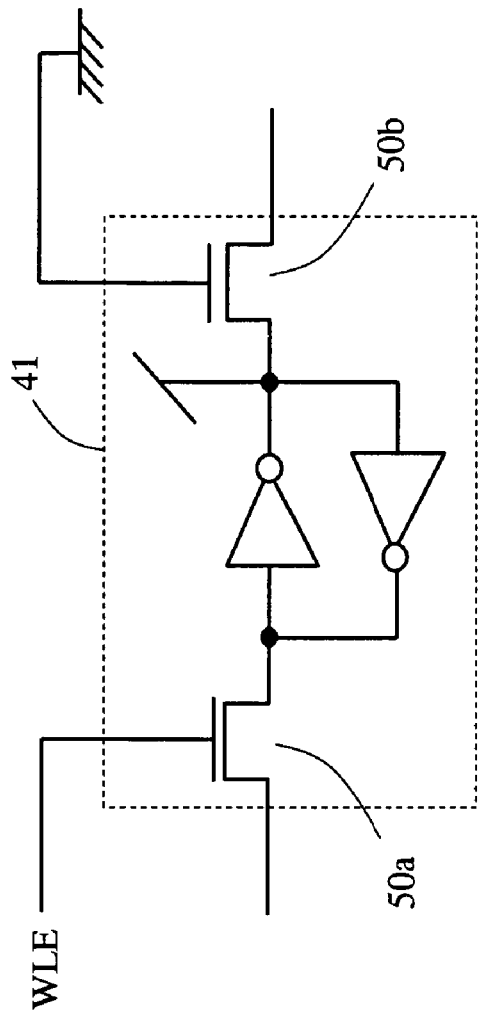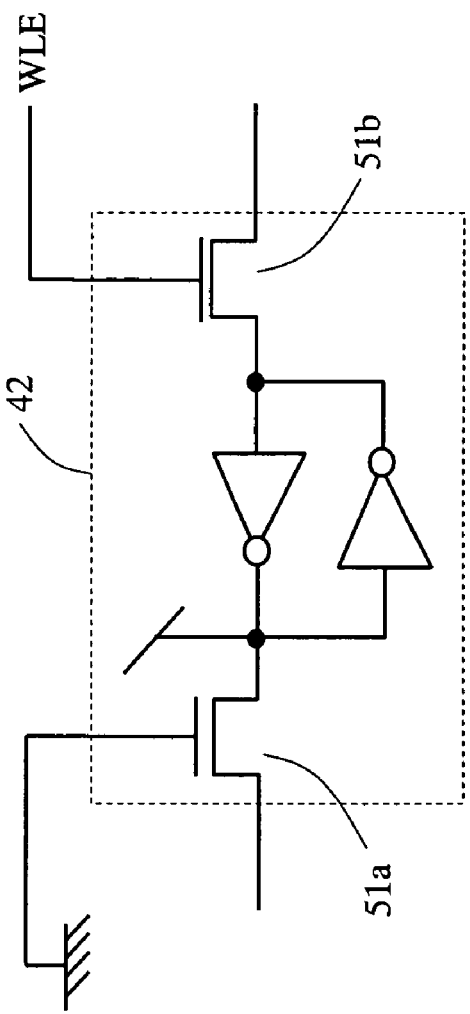
FIG. 8A
FIG. 8B

SEMICONDUCTOR MEMORY DEVICE HAVING READ OPERATION TESTING FUNCTION

BACKGROUND OF THE INVENTION

1. Field of the Invention

The present invention relates to a semiconductor memory device, such as a static RAM or the like, which has a function of testing a read operation for screening.

2. Description of the Background Art

In recent years, the integration degree of transistors formed in a semiconductor integrated circuit is more and more increased with the advance of technology. Also, the memory size of an SRAM or the like which is essentially required for constituting a system circuit on a chip ever increases, and thus, the area of a memory region on a chip also tends to increase. In general semiconductor memory devices, the area of the memory region is scaled down by reducing the transistor size of each memory cell to the extent possible so as to suppress a decrease in yield and an increase in chip cost due to an increase in the area of the memory region.

When the transistor size is decreased, the driving capacity of the transistor in a memory cell is reduced, resulting in a slow read speed. To solve the problem, a technique of amplifying data retrieved from the memory cell by a sense amplifier has been conventionally used to improve a read speed.

However, memories with such a structure are likely to have a poorly-reproducible defect, since an operation of reading and amplifying minute data is easily affected by external disturbance. For example, a read operation may be performed normally or erroneously, depending on an operating condition during the read operation. As the area of the memory region is increased, a probability that dust enters the memory region during a manufacturing process increases, leading to an increase in rate of memories having a poor-reproducibile defect. An integrated circuit device having such a memory which has a poor-reproducible defect, which may be recognized as a non-defective product during a test operation, is likely to malfunction and cause an enormous trouble in an electronic apparatus in which the integrated circuit device is incorporated. Therefore, it is necessary to reliably screen out a memory which has a poor-reproducibile defect, during the test operation.

Conventionally, a test method of detecting not only a memory which has a easily detectable defect, but also a memory which has a poor-reproducibile defect, has been conventionally proposed (see, for example, Japanese Patent Laid-Open Publication No. 02-206087). Here, the conventional defect detecting method will be described with reference to FIGS. 12 and 13. FIG. 12 illustrates a circuit configuration of a semiconductor memory device having a static RAM. The semiconductor memory device is composed of memory cells Mn_m (n: 1, 2, 3, . . . ; m: 1, 2, 3, . . . ) which are arranged in a matrix within a memory region, and a peripheral circuit.

Each memory cell Mn_m is composed of two inverter circuits 21a and 21b which constitute a latch for holding data, and access transistors 22a and 22b which connect the latch and bit lines BLm and NBLm (m: 1, 2, 3, . . . ) and whose gate electrodes are connected to a word line WLn. For example, each memory cell Mn_m stores "1" when left and right memory holding nodes (latch nodes) have an H level and an L level, respectively, as in a memory cell M1_1 of FIG. 12, and stores "0" when the left and right memory holding nodes have the L level and the H level, respectively, as in the memory cell M2_1.

A read operation of the SRAM circuit of FIG. 12 will be described with reference to a timing chart of FIG. 13. In the timing chart, a time period T1 indicates an ordinary read operation (ordinary mode) period, and a time period T2 indicates a test operation (test mode) period. In an initial state, each pair of bit lines BLm and NBLm are precharged to an H level corresponding to a power supply voltage (VDD). For example, when a stored value is read out from the memory cell M1_1 and when the memory cell M1_is tested, the memory holding nodes of the memory cell M1_m and the pair of bit lines BLm and NBLm are brought into conduction by causing the potential level of the word line WL1 to rise to the H level. Thereby, the potential of the bit line BLm or NBLm gradually falls to the L level, so that a potential difference occurs between the pair of bit lines BLm and NBLm.

Here, it is assumed that the access transistor 22b of the memory cell M1_1 has a defect, and therefore, has lower driving capacity than that of the normal access transistor 22b of the memory cell M1_2. Therefore, a potential falling rate of the bit line NBL1 is slower than that of the bit line BL2.

A select circuit 35 outputs a signal obtained by delaying a pulse signal SA using a delay circuit 36, as a sense amplifier activating signal SAE, during the ordinary read operation, and outputs the pulse signal SA without a delay in the delay circuit 36, as a sense amplifier activating signal SAE, during the test operation. A sense amplifier 32, when receiving the sense amplifier activating signal SAE, amplifies a differential input of the pair of bit lines BL1 and NBL1 selected by a column selector 31, and outputs the result as a sense output SO. Note that it is determined on the basis of a test mode signal TST whether or not the signal SA is delayed by the delay circuit 36.

During the ordinary read operation, the potential difference between the pair of bit lines BL1 and NBL1 when the defective memory cell M1_is read may become equal to a threshold potential difference (offset voltage) required for a correct operation of the sense amplifier 32, depending on a time until the sense amplifier 32 is activated. In this case, the sense amplifier output SO is likely to become unstable, i.e., go to the H level (normal read operation) at some times or the L level (erroneous read operation) at other times.

On the other hand, during the test operation, sense amplifier activation timing is earlier than that during the ordinary read operation, and therefore, a variation in the potential difference of the pair of bit lines BL1 and NBL1 is smaller than that during the ordinary read operation. Thus, conventionally, a test method of determining a stored value using a smaller potential difference between a pair of bit lines by setting the timing of activating the sense amplifier 32 to be earlier than that during the ordinary read operation, has been proposed.

However, in the conventional technique, a difference between a read potential during the ordinary read operation and a read potential during the test operation is determined by a cell current when the sense amplifier is activated, and has a value in proportional to the cell current. Therefore, a difference between a cell current during the ordinary read operation and a cell current during the test operation, which is set under an assumption that external disturbance noise occurs, depends on the driving capacity of each memory cell, and varies among memory cells. When a memory cell having an extremely small cell current is tested, a sufficient test margin cannot be obtained, so that an unstable defect may not be detected.

In the read technique of amplifying a minute potential difference, it is determined whether or not a test is normally performed, depending on a relationship between the magnitude of a threshold potential difference (offset voltage) for correctly operating a sense amplifier, and the driving capacity of the memory cell Mn_m which causes the potential difference. The above-described conventional technique is effective when the offset voltage is increased due to a variation in characteristics of a transistor included in the sense amplifier 32 and therefore an unstable state occurs. However, the above-described conventional technique is not very effective when there is substantially no offset voltage and the cell current is small, nevertheless an unstable state occurs. To detect the latter defect which causes an unstable state, it is necessary to advance the activation timing of the sense amplifier to a large extent. In this case, however, a memory cell, which operates stably and normally, is likely to be read in an abnormal manner, resulting in an adverse effect, such as a reduction in yield.

SUMMARY OF THE INVENTION

In view of the above problems, an object of the present invention is to provide a storage device which can reliably detect a memory cell in which an unstable operation occurs due to a small memory cell current.

The present invention provides a semiconductor memory device having a function of testing a read operation, comprising a plurality of memory cells, each of which includes a pair of memory holding nodes, and two access transistors each having a gate electroded connected to the same word line, wherein one of the access transistor connects one of the memory holding nodes to one of a pair of bit lines, the other access transistor connects the other memory holding nodes to the other bit line, and a memory state is determined based on potentials of the memory holding node, a bit line drive section for connecting a selected one of the pair of bit lines to a predetermined potential level, and a sense amplifier for amplifying a potential difference between the pair of bit lines and outputting the amplified potential difference, in accordance with an input of a sense amplifier activating signal. When a read operation is tested, the bit line drive section connects at least one of the pair of bit lines to the predetermined potential level upon or immediately before selection of a word line connected to a memory cell to be tested, to reduce the potential difference of the pair of bit lines by a predetermined value.

The potential difference of the pair of bit lines after being reduced by the predetermined value may be smaller than an operating threshold of the sense amplifier, or may reverse in sign as compared to an original one.

Desirably, the bit line drive section may be provided with respect to the same pair of bit lines as that of the memory cell to be tested, and may include the same circuit elements as those of the memory cell to be tested.

More desirably, the bit line drive section has the same layout configuration as that of the memory cell to be tested.

More specifically, the bit line drive section may be a memory cell whose memory state is controlled so as to be different from that of the memory cell to be tested, and upon or immediately before selection of the word line connected to the memory cell to be tested, a word line to which a memory cell serving as the bit line drive section is connected may be selected only for a time period less than the selection time period.

The bit line drive section may include a potential supply point for supplying a predetermined potential, and two potential adjusting transistors having gate electrodes connected to two different control lines, respectively, one of the potential adjusting transistor connecting one of the pair of bit lines to the potential supply point, and the other potential adjusting transistor connecting the other bit line to the potential supply point. Upon or immediately before selection of the word line to which the memory cell to be tested is connected, one of the control lines may be selected only for a time period less than the selection time period.

The potential supply point may supply a potential having a magnitude which decreases a potential of a bit line connected to a high potential-side memory holding node.

The potential supply point may supply a potential having a magnitude which increases a potential of a bit line connected to a low potential-side memory holding node.

The semiconductor memory device of the present invention may further comprise an equalization circuit connecting bit lines on the same sides of adjacent rows, and an equalization circuit control section for controlling the equalization circuit so that bit lines having the same potential level are brought into conduction when a test is performed.

The semiconductor memory device of the present invention may further comprise a plurality of replica memory cells provided with respect to a pair of dummy bit lines, a pulse generating circuit for generating a control signal for the bit line drive circuit based on a potential level of one of the pair of dummy bit lines, and a sense amplifier activating signal generating circuit for generating a drive signal for the sense amplifier based on a potential level of the other of the pair of dummy bit lines. The number of replica memory cells for driving the one dummy bit line may be larger than the number of replica memory cells for driving the other dummy bit line.

According to the semiconductor memory device of the present invention, when, due to a defect in a memory cell, a sufficient cell current is not obtained, the magnitude of the bit line pair potential difference (bit line amplitude) is smaller than or equal to the operating threshold of the sense amplifier, or the potential difference which reverses in sign as compared to the ordinary read operation is obtained, thereby making it possible to reliably elicit an erroneous operation.

According to the semiconductor memory device of the present invention, the bit line pair potential difference during the test operation is reduced by directly changing the bit line potential instead of adjusting read timing, which is performed in the conventional art. Therefore, it is possible to secure a predetermined test margin for any memory cell.

Therefore, the sensitivity of defect detection can be improved as compared to the conventional art, thereby making it possible to more reliably screen out a defective memory which causes a system failure after being incorporated into an electronic apparatus. Also, according to the semiconductor memory device of the present invention, since it is not necessary to perform a test while changing the operating condition in various manners, test cost can be suppressed and it does not take a long time to perform a test.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4A and 4B are layout diagrams of a memory cell and a bit line drive circuit, respectively;

FIGS. 8A and 8B are exemplary circuit diagrams of replica memory cells;

DESCRIPTION OF THE PREFERRED EMBODIMENTS

Hereinafter, semiconductor memory devices according to embodiments of the present invention will be described with reference to the accompanying drawings. Here, the semiconductor memory device is assumed to be a static RAM including a test circuit.

First Embodiment

Figure 1:
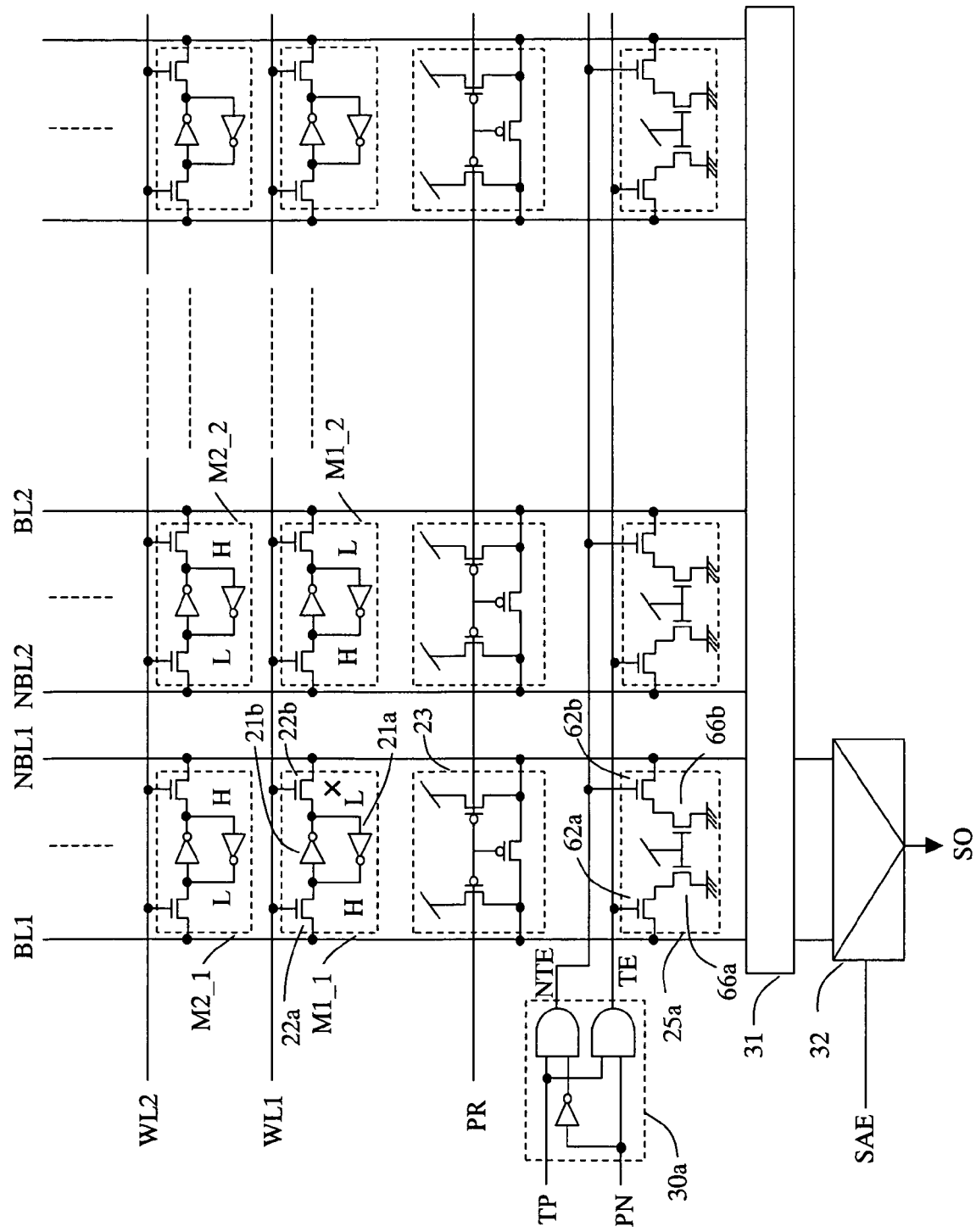
FIG. 1 is a circuit diagram of a semiconductor memory device according to a first embodiment of the present invention.

FIG. 1 illustrates a circuit configuration of a semiconductor memory device (SRAM) according to a first embodiment of the present invention. The semiconductor memory device comprises memory cells Mn_m (n: 1, 2, 3, . . . ; m: 1, 2, 3, . . . ), a precharge circuit 23, a bit line drive circuit 25a, a test circuit 30a, a column selector 31, and a sense amplifier 32. The semiconductor memory device further comprises a row decoder circuit for selecting a word line WLn based on an input address signal and an input clock.

Each memory cell Mn_m comprises two inverter circuits 21a and 21b which constitute a latch, and access transistors 22a and 22b which connect the latch and a pair of bit lines BLm and NBLm and whose gate is connected to the word line WLn.

The bit line drive circuit 25a is provided for each pair of bit lines BLm and NBLm, and has a configuration which can lower a potential of one selected from the pair of bit lines BLm and NBLm. More specifically, the bit line drive circuit 25a comprises access transistors 62a and 62b which are provided between the bit lines BLm and NBLm and the ground and whose gate electrodes are connected to different test signal lines TE and NTE, respectively. When the test circuit 30a selects one of the test signal lines TE and NTE, one of the bit lines BLm and NBLm is grounded during a time when the access transistor 62a or 62b is in the ON state.

Figure 2:
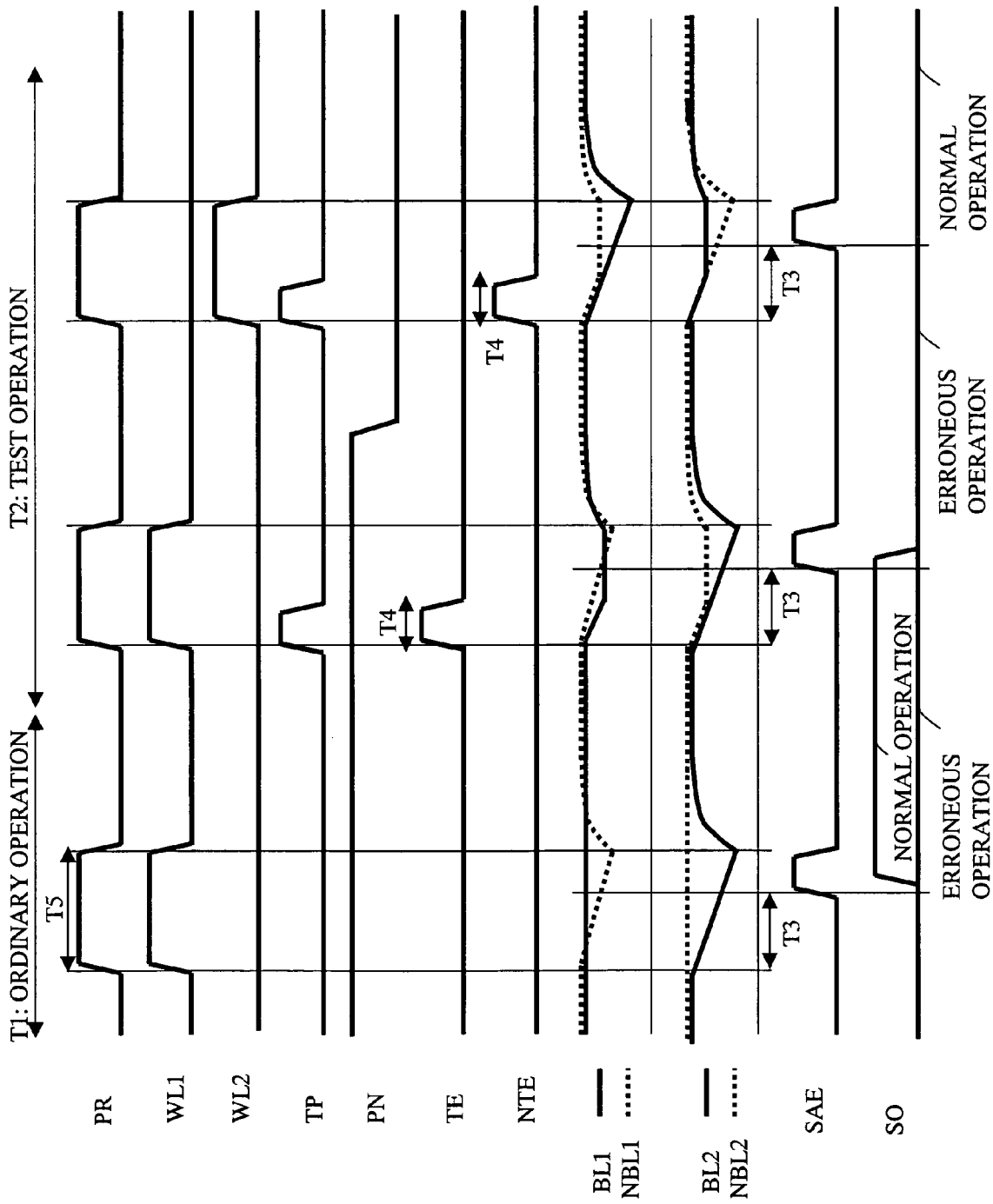
FIG. 2 is a timing chart of a read operation and a test operation of the semiconductor memory device of FIG. 1.

In a timing chart of FIG. 2, a time period T1 and a time period T2 indicate an ordinary read operation (ordinary mode) period and a test operation (test mode) period of the semiconductor memory device of FIG. 1. Hereinafter, the ordinary read operation and the test operation of a memory cell M1_1 will be described using the timing chart. Note that it is assumed that the access transistor 22b of the memory cell M1_1 has a defect, and therefore, has lower driving capacity than that of other normal access transistors 22b.

A precharge signal PR is at the L level in the initial state during the ordinary read operation as well as during the test operation. In this case, each pair of bit lines BLm and NBLm are precharged to the H level which is same as a level of the power supply potential VDD.

During the ordinary read operation, when the word line WL1 is selected (controlled to rise to the H level), so that the access transistors 22a and 22b of the memory cell M1_m turn to the ON state, potentials of the bit lines NBL1 and BL1 in conduction with an L-side memory holding node fall to the L level. In this case, a potential falling rate of the bit line NBL1 is slower than that of the bit line BL2 and the like due to the defect of the access transistor 22b, as illustrated in FIG. 2.

When a predetermined time T3 has passed since the word line WL1 rose to the H level, a sense amplifier activating signal SAE is input to the sense amplifier 32, so that a potential difference between the pair of bit lines BL1 and NBL1 selected by the column selector 31 is amplified by the sense amplifier 32. When the driving capacity of the access transistor 22b is insufficient, the potential difference between the pair of bit lines BL1 and NBL1 when the sense amplifier 32 is activated may be smaller than an operating threshold (offset voltage) of the sense amplifier 32. In this case, a sense amplifier output SO may go to the L level (erroneous read operation). Also, the sense output SO from the memory cell M1_1 during the ordinary read operation may be at the H level (normal read operation), depending on the operating condition.

To reliably detect such a memory cell whose read value varies depending on the operating condition, a control is performed in the test mode so that an erroneous read operation is invariably elicited in such a memory cell. This control will be hereinafter described.

As illustrated in the timing chart of FIG. 2, during the test operation, a test pulse signal TP is caused to be at the H level for a predetermined time period T4 since the word line WL1 is selected. Here, the predetermined time period T4 is shorter than a time period T5 for which the potential of the word line WL1 is at the H level. Thereby, an H level-side memory holding node is brought into conduction with the bit line BL1 precharged at the H level, and the bit line BL1 is grounded, so that the potential of the bit line BL1 is decreased by a predetermined value during the predetermined time period T4.

In the semiconductor memory device of this embodiment, in order to perform such a control, the potential difference between the pair of bit lines BL1 and NBL1 when the sense amplifier 32 is activated is smaller than the operating threshold of the sense amplifier 32, or reverses in sign as compared to the ordinary read operation. Therefore, an erroneous read operation can be reliably elicited during the test operation. Note that, the sense amplifier activation timing is the same both during the ordinary read operation and the test operation.

It is determined on the basis of a selection signal PN which one of potentials of bit lines is to be changed. For example, during the test operation of the memory cell M1_in which the potential levels of the left and right memory holding nodes are the H level and the L level, respectively, a select signal PN is set to be at the H level so as to vary the potential of the left-side bit line BL1. Therefore, when the test signal TP is input, the signal TE rises to the H level and the signal NTE falls to the L level, so that the source and drain of the access transistor 62a are brought into conduction and the left-side bit line BL1 is grounded.

Similarly, during the test operation of a memory cell M2_1 in which the potential levels of the left and right memory holding nodes are at the L level and the H level, respectively, the select signal PN is set to be at the L level so as to vary the potential of the right-side bit line NBL1. In this case, when the signal TP is input to the test circuit 30a, the test signal lines TE and NTE go to the L level and the H level, respectively, so that the source and drain of the access transistor 62b are brought into conduction, and the H level-side bit line NBL1 is grounded.

Figure 3A:
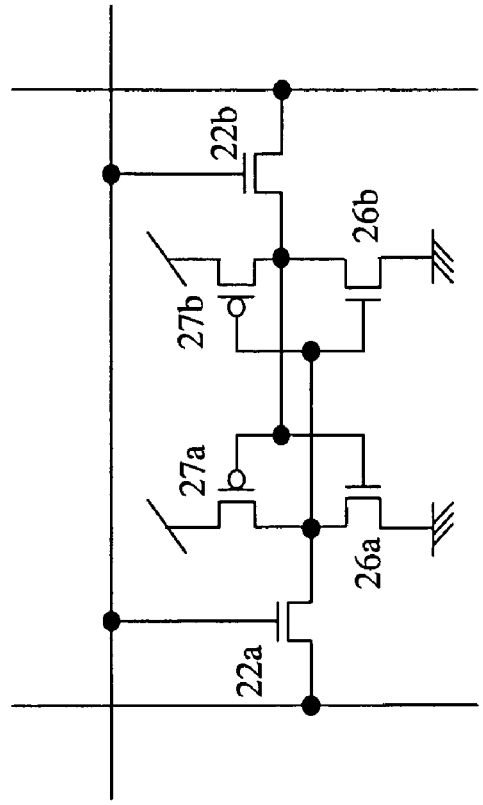
FIGS. 3A and 3B are exemplary circuit diagrams of a memory cell and a bit line drive circuit, respectively.
Figure 3B:
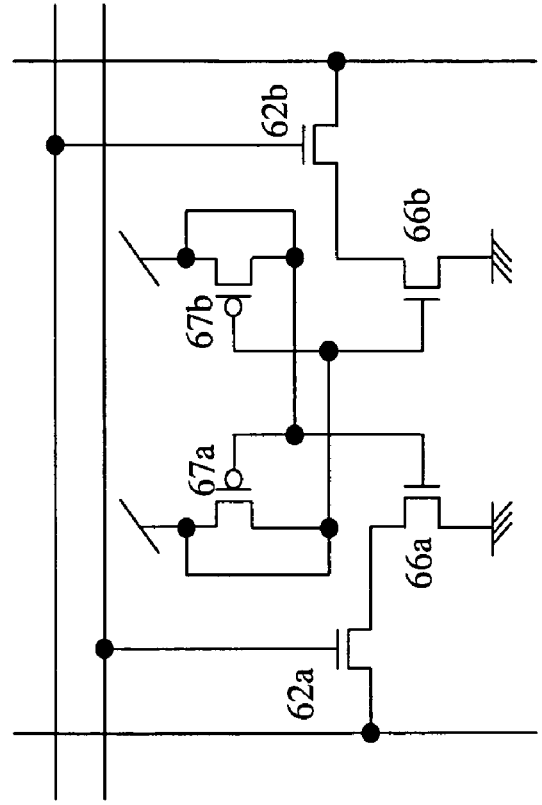

FIGS. 3A and 3B are exemplary circuit diagrams of the memory cell Mn_m and the bit line drive circuit 25a, respectively. As indicated with these examples, the memory cell Mn_m is composed of six MOS transistors, and the bit line drive circuit 25a is composed of six MOS transistors which are the same as those of the memory cell Mn_m. Specifically, the access transistors 62a and 62b, drive transistors 66a and 66b, and load transistors 67a and 67b of the bit line drive circuit 25a are formed in the same manner as that of the access transistors 22a and 22b, drive transistors 26a and 26b, and load transistors 27a and 27b of the memory cell Mn_m.

In the bit line drive circuit 25a, the drains of the load transistors 67a and 67b are disconnected from the drains of the drive transistors 66a and 66b, and are fixed to the power supply potential (VDD). As a result, the gate electrodes of the drive transistors 66a and 66b are also fixed to the power supply potential.

FIGS. 4A and 4B illustrate layout configurations of the circuits of FIGS. 3A and 3B, respectively. As illustrated in FIGS. 4A and 4B, the memory cell Mn_m and the bit line drive circuit 25a have the same shapes of diffusion layers DN1, DN2, DP1 and DP2, and the same gate electrode lengths and gate electrode widths of polysilicon gate electrodes GA1, GA2, GA3 and GA4. By changing a shape of an metal wirings in an upper layer, the respective circuits are constructed.

Thus, if the memory cell Mn_m and the bit line drive circuit 25a are constructed with the same transistors, the cell current of the memory cell Mn_m and the drive current of the bit line drive circuit 25a become the same as each other. Therefore, only by performing a drive control of the test signal line TE or NTE in addition to the control during the ordinary read operation, the bit line pair potential difference can be adjusted, and circuit design for achieving this is not complicated.

Further, if the cell current of the memory cell Mn_m and the drive current of the bit line drive circuit 25a have the same characteristics, a variation in characteristics with respect to an operating voltage and ambient temperature is the same between the memory cell Mn_m and the bit line drive circuit 25a. As illustrated in FIGS. 4A and 4B, if the memory cell Mn_m and the bit line drive circuit 25a have the same layout structure, variations in transistor characteristics thereof which depend on the layout, become similar, thereby making it possible to perform a bit line potential control with more accuracy.

According to the test method employing the semiconductor memory device of the present invention, after the potential of the H level-side bit line is lowered to reduce the potential difference between the pair of bitlines irrespective of the magnitude of the cell current, the potential difference is detected. According to this method, when, due to a defect in a memory cell, a sufficient cell current is not obtained, the magnitude of the difference between the pair of bit lines (bit line amplitude) is smaller than or equal to the operating threshold of the sense amplifier, or the potential difference which reverses in sign as compared to the ordinary read operation is obtained, thereby making it possible to reliably elicit an erroneous operation.

According to the semiconductor memory device of this embodiment, the potential difference between the pair of bit lines during the test operation is reduced by directly changing the bit line potential instead of adjusting read timing, which is performed in the conventional art. Therefore, according to the semiconductor memory device of this embodiment, it is possible to secure a predetermined test margin for any memory cell.

As described above, according to the semiconductor memory device of the present invention, the sensitivity of defect detection can be improved as compared to the conventional art, thereby making it possible to more reliably screen out a defective memory which causes a system failure after being incorporated into an electronic apparatus. Also, according to the semiconductor memory device of the present invention, since it is not necessary to perform a test while changing the operating condition in various manners, test cost can be suppressed and it does not take a long time to perform a test.

Second Embodiment

Figure 5:
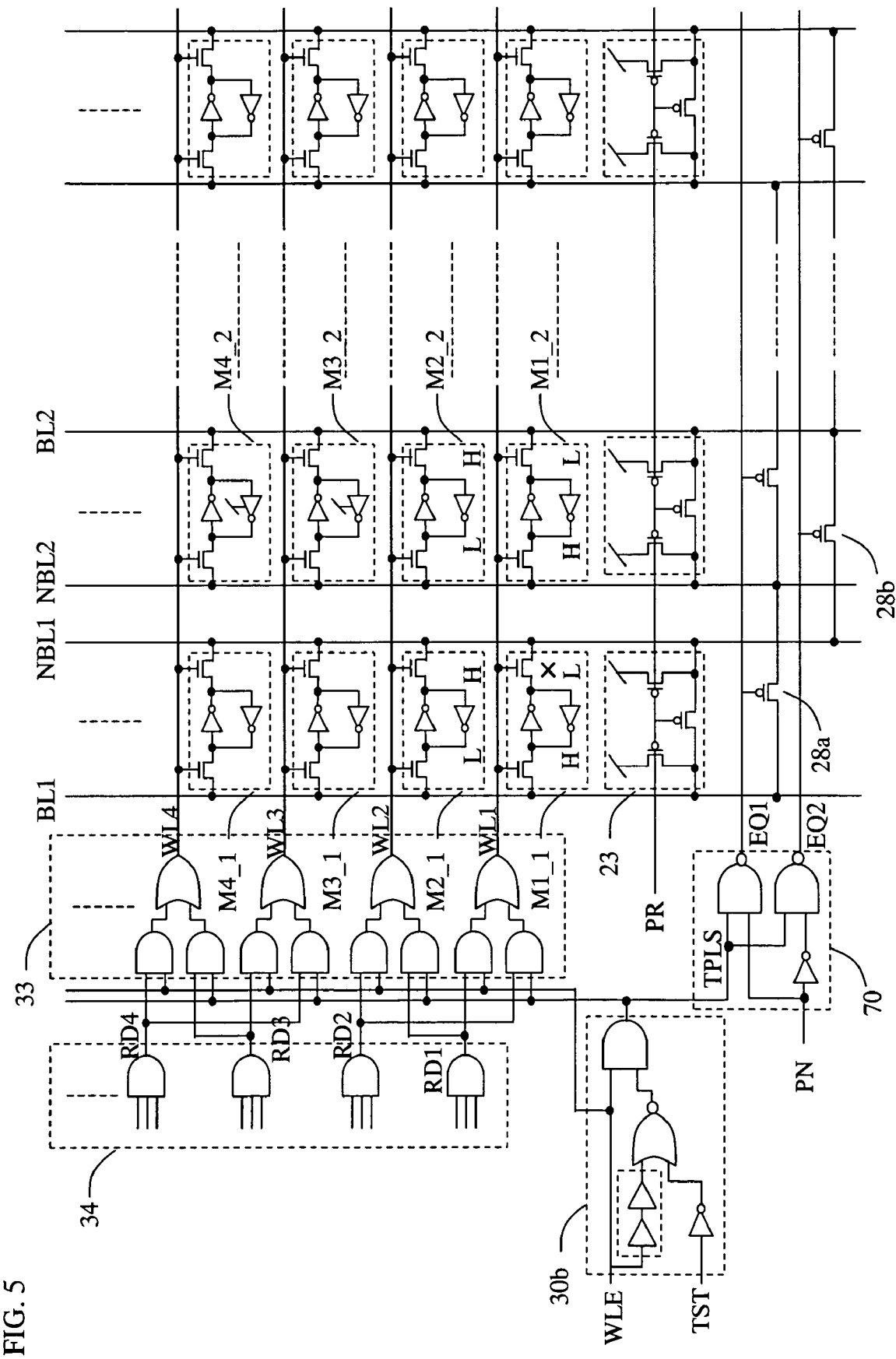
FIG. 5 is a circuit diagram of a semiconductor memory device according to a second embodiment of the present invention.

FIG. 5 illustrates a circuit configuration of a semiconductor memory device according to a second embodiment of the present invention. The semiconductor memory device comprises memory cells Mn_m (n: 1, 2, 3, . . . ; m: 1, 2, 3, . . . ), a precharge circuit 23, a word line drive circuit 33, a row decoder circuit 34, a test circuit 30b, an equalization circuit drive section 70, bit line equalizing transistors 28a and 28b, and a column selector and a sense amplifier (not shown), and the like.

The semiconductor memory device of this embodiment is different from that of the first embodiment of FIG. 1 in a part of circuits which are used during a test operation (e.g., a bit line drive circuit and a test circuit). In this embodiment, the same parts as those of the semiconductor memory device of the first embodiment are indicated with the same reference numerals and will not be described.

In the semiconductor memory device of this embodiment, a memory cell Mα_m (α: an odd integer equal to or less than n) and a memory cell M(α+1)_m serve as a memory cell to be tested and its bit line drive circuit with respect to each other. The word line drive circuit 33 and the test circuit 30b are provided so as to simultaneously control word lines WLα and WL(α+1) to which a pair of the memory cells Mα_m and M(α+1)_m are connected, respectively.

Figure 6:
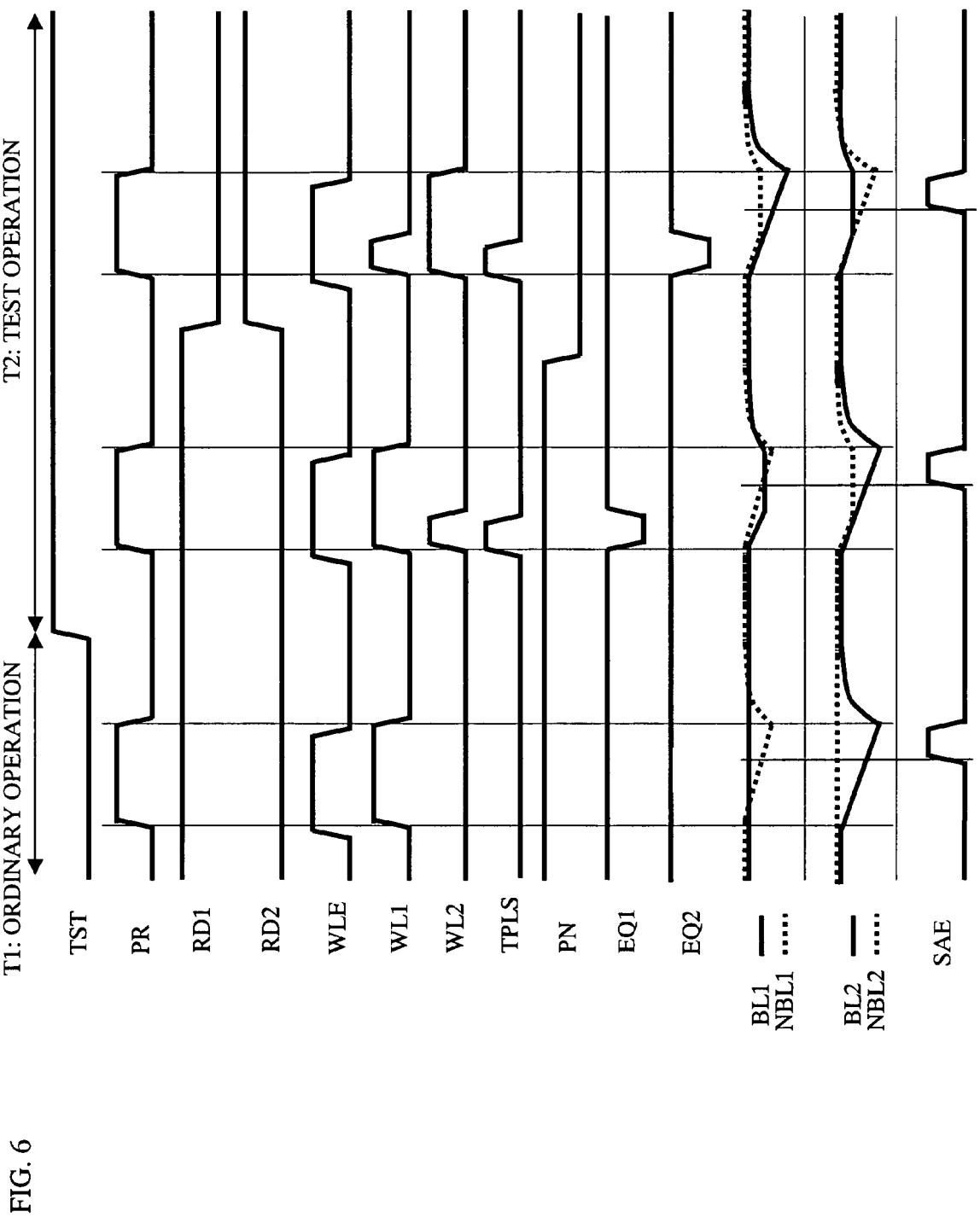
FIG. 6 is a timing chart of a read operation and a test operation of the semiconductor memory device of FIG. 5.

In a timing chart of FIG. 6, periods T1 and T2 indicate an ordinary read operation (ordinary mode) period and a test operation (test mode) period of the semiconductor memory device of FIG. 5. Hereinafter, the ordinary read operation and the test operation of a memory cell M1_will be described using the timing chart. Here, it is assumed that the access transistor 22b of the memory cell M1_1 has a defect, and therefore, has lower driving capacity than that of other normal access transistors 22b.

Firstly, the case where a stored value is read from the memory cell M1_1 will be described. During the ordinary read operation, in an initial state, a bit line precharge signal PR and a word line enable signal WLE are each at the L level. A test signal TST is invariably at the L level. When a signal RD1 which is an output of the row decoder circuit 34 is at the H level, a word line WL1 rises to the H level in synchronization with a clock input of the word line enable signal WLE. In this case, a potential falling rate of a bit line BL1 in conduction with the L-side memory holding node is slow due to a defect in the access transistor 22b, so that the sense amplifier output SO falls to the L level (erroneous read operation). The sense amplifier output SO may rise to the H level (normal read operation), depending on the operating condition, i.e., the sense amplifier output SO is unstable during the ordinary read operation of the memory cell M1_.

Next, the test operation will be described. During the test operation, initially, a value which is reverse to that of the memory cell M1_to be tested is stored in a memory cell M2_which serves as a bit line drive circuit. More specifically, when the left and right memory holding nodes of the memory cell M1_are set to be at the H level and the L level, respectively, the left and right memory holding nodes of the memory cell M2_are set to be at the L level and the H level, respectively. During the test operation, the test signal TST is caused to be invariably at the H level.

Based on the input of the word line enable signal WLE, the word line WL1 rises to the H level, and also, a word line WL2 rises to the H level in synchronization with a test pulse signal TPLS transition to the H level only for a predetermined period. When the word line WL1 rises to the H level, the memory holding nodes of the memory cell M1_1 and the pair of bit lines BL1 and NBL1 are brought into conduction, so that the potential of the bit line NBL1 falls. In this case, the word line WL2 is at the H level for a predetermined time, so that the memory holding nodes of the memory cell M2_and the pair of bit lines BL1 and NBL1 are also brought into conduction, and therefore, the potential of the bit line BL1 falls by a predetermined value for a predetermined time.

Therefore, during the test operation, a potential difference between the pair of bit lines BL1 and NBL1 is invariably smaller than the operating threshold of the sense amplifier, or the potential difference reverses in sign as compared to the normal read operation, so that the sense amplifier output SO which is different from that during the normal read operation is obtained. Therefore, when a read operation is performed with respect to a memory cell in which a failure unstably occurs, an erroneous read operation can be reliably elicited.

Thus, if a memory cell, which is one of memory cells for storing data and is different from a memory cell to be tested, is utilized as a bit line drive circuit for the memory cell to be tested, it is not necessary to provide an additional bit line drive circuit. Also, the memory cell to be tested and the memory cell serving as a bit line drive circuit have the same configuration and are formed in a similar manner, and therefore, have the same variation in characteristics with respect to an operating voltage and ambient temperature, thereby making it possible to obtain a test result which does not depend on the operating condition. Therefore, according to the semiconductor memory device and test method of the present invention, the sensitivity of defect detection can be improved as compared to the conventional art.

In this embodiment, as illustrated in FIG. 5, equalization transistors 28a and 28b are provided which connect bit lines on the same sides (left sides and right sides, respectively) of adjacent columns. More specifically, the equalization circuit 28a is provided so as to connect the bit line BL1 and the bit line NBL2, and the equalization circuit 28b is provided so as to connect the bit line NBL1 and the bit line BL2. The gate electrodes of the equalization transistors 28a and 28b are connected to equalization circuit control signal lines EQ1 and EQ2, respectively.

One of the equalization circuit control signal lines EQ1 and EQ2 falls to the L level in synchronization with the input of the test pulse signal TPLS, so that the equalization transistor 28a or 28b turns to the ON state. It is determined which one of the equalization circuit control signal lines EQ1 and EQ2 falls to the L level, depending on whether a signal PN is at the H level or the L level. When the equalization transistor 28a or 28b turns to the ON state, bit lines connected to both ends thereof are brought into conduction, so that the bit lines have the same potential.

The memory cell Mn_m has a smaller transistor size so as to reduce its area. A variation in characteristics of the memory cell increases as the transistor size decreases. By providing the equalization circuits 28a and 28b, the control voltage level of a bit line can be held constant, thereby overcoming this drawback. Note that the equalization transistors 28a and 28b may be employed in the semiconductor memory device of the first embodiment.

Third Embodiment

Figure 7:
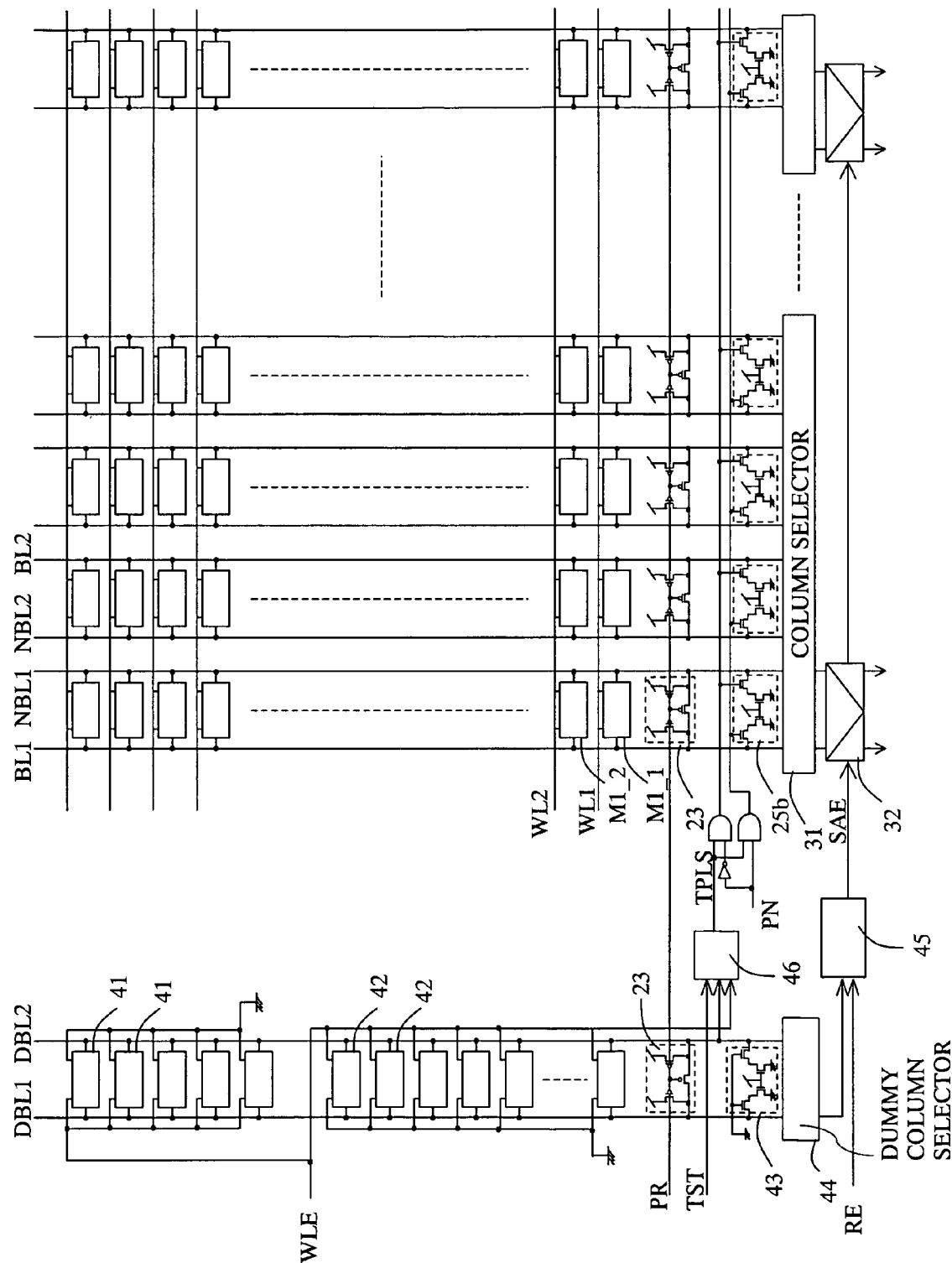
FIG. 7 is a circuit diagram of a semiconductor memory device according to a third embodiment of the present invention.

FIG. 7 illustrates a circuit configuration of a semiconductor memory device according to a third embodiment of the present invention. In this embodiment, the same parts as those of the semiconductor memory device of the first embodiment are indicated with the same reference numerals and will not be described.

In this embodiment, specific exemplary circuits for generating the sense amplifier activating signal SAE and the test pulse signal TPLS during the test operation will be described. To generate these circuits, the semiconductor memory device of this embodiment comprises a replica circuit provided with respect to dummy bit lines DBL1 and DBL2, a sense amplifier activating signal generating circuit 45 (hereinafter referred to as a SAE generating circuit), and a pulse generating circuit 46.

The replica circuit is composed of a replica memory cell 41 for driving the dummy bit line DBL1, a replica memory cell 42 for driving the dummy bit line DBL2, a replica memory cell (not shown) in which the word line WLn is fixed to the L level, a precharge circuit 23 which is the same as that connected to the pair of bit lines BLm and NBLm, a dummy bit line drive circuit 43, and a dummy column selector 44. The number of the replica memory cells 42 is larger than the number of the replica memory cells 41. The total number of the replica memory cells provided between the dummy bit lines DBL1 and DBL2 is the same as the total number of memory cells Mn_m provided between the pair of normal bit lines BLm and NBLm. Thus, the dummy bit lines DBL1 and DBL2 have the same circuit configuration as that of the pair of normal bit lines BLm and NBLm.

FIGS. 8A and 8B illustrate circuit examples of the replica memory cells 41 and 42. A memory holding node closer to the dummy bit line DBL2 (right side) of the replica memory cell 41 is fixed to the power supply potential VDD, and the gate electrode of an access transistor 50b is grounded. An access transistor 50a is controlled using the word line enable signal WLE. A memory holding node closer to the dummy bit line DBL1 (left side) of the replica memory cell 42 is fixed to the power supply potential VDD, and the gate electrode of an access transistor 51a is grounded. An access transistor 51b is controlled using the word line enable signal WLE.

Figure 9:
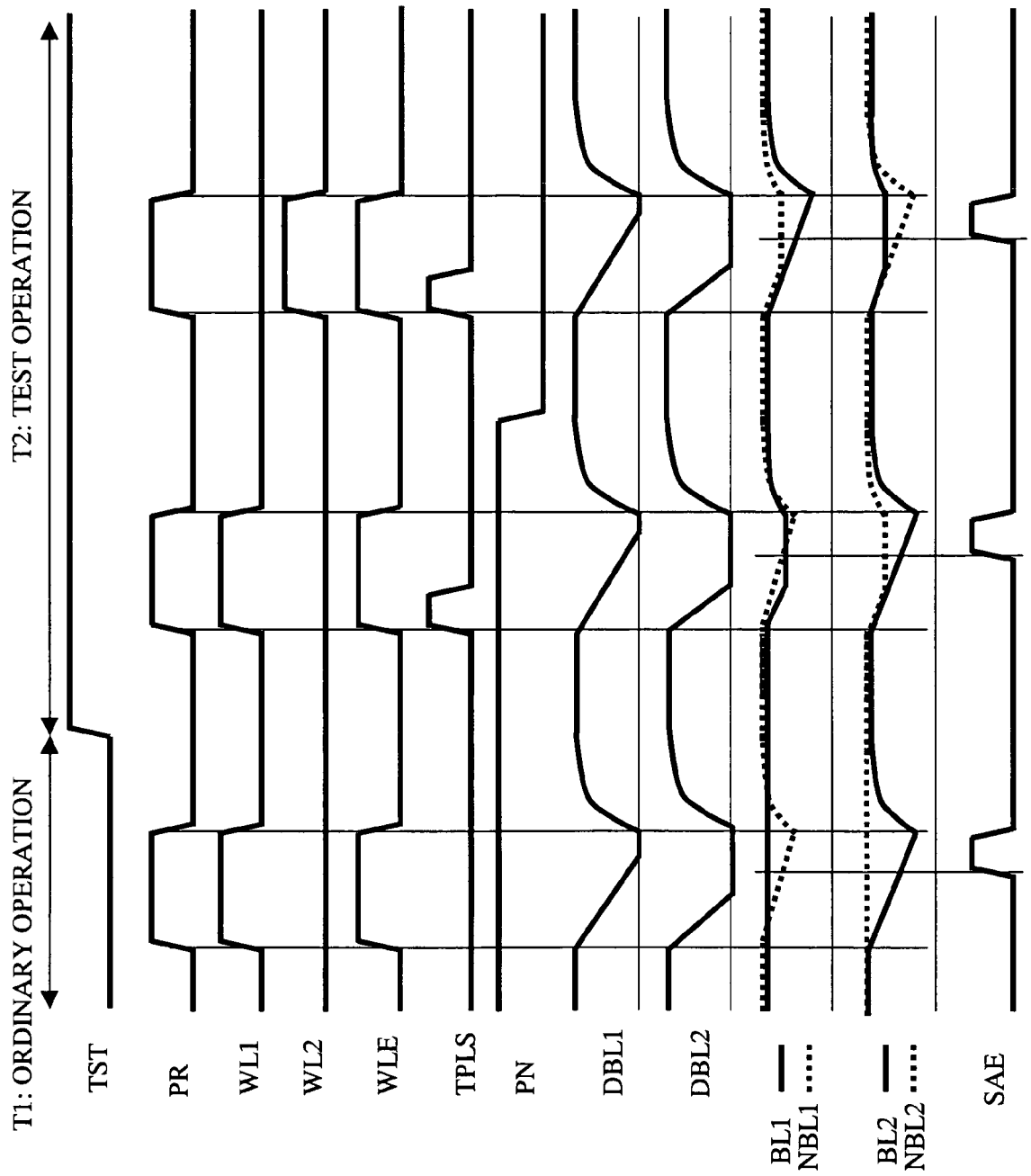
FIG. 9 is a timing chart of a read operation and a test operation of the semiconductor memory device of FIG. 7.

In a timing chart of FIG. 9, periods T1 and T2 indicate a read operation (ordinary read mode) period and a test operation (test mode) period of the semiconductor memory device of FIG. 8. Hereinafter, the ordinary read operation and the test operation of the memory cell M1_1 will be described using the timing chart. Here, it is assumed that the access transistor 22b of the memory cell M1_1 has a defect, and therefore, has lower driving capacity than that of other normal access transistors 22b.

Firstly, the ordinary read operation will be described. When the word line WL1 rises to the H level, so that the access transistors 22a and 22b of the memory cell M1_m turn to the ON state, the potentials of the bit lines NBL1 and BL1 in conduction with the L-side memory holding node fall to the L level. In this case, due to the defect in the access transistor 22b, as illustrated in FIG. 2, the potential falling rate of the bit line NBL1 is slower than the potential falling rates of the bit line BL2 and the like.

In this embodiment, a sense amplifier activating signal is generated as follows. In an initial state, the precharge signal PR is at the L level, so that the dummy bit lines DBL1 and DBL2 are precharged to the H level as are similar to the pair of normal bit lines BLm and NBLm. Thereafter, when the precharge signal PR and the word line enable signal WLE rise to the H level, the L-side memory holding nodes of the replica memory cells 41 and 42 and the dummy bit lines DBL1 and DBL2 are brought into conduction, so that the potential levels of the dummy bit lines DBL1 and DBL2 fall to the L level.

Thereafter, the transition of the dummy bit line DBL1 to the L level triggers output of the sense amplifier activating signal SAE of the SAE generating circuit 45. Thereby, the sense amplifier 32 amplifies and outputs a potential difference between the pair of bit lines BL1 and NBL1 selected by the column selector 31. During the ordinary read operation, since a test pulse signal TST is invariably at the L level, the test pulse signal TPLS is not generated in the pulse generating circuit 46, so that an access transistor of a bit line drive circuit 25b is invariably in the OFF state.

On the other hand, during the test operation, the test pulse signal TST is controlled to be invariably at the H level. The pulse generating circuit 46 generates a test pulse signal TPLS which is defined by a period between a rising edge of the word line enable signal WLE and a falling edge of the dummy bit line DBL2. In accordance with the test pulse signal TPLS, one of the access transistors included in the bit line drive circuit 25b turns to the ON state, so that the potential level of the bit lines BLm and NBLm in conductive with the H level-side memory holding node is decreased by a predetermined value. It is determined on the basis of the potential level of the signal PN which one of potential levels of the bit lines BLm and NBLm is to be changed.

The number of the replica memory cells 42 which change the potential level of the dummy bit line DBL2 is larger than the number of the replica memory cells 41 which change the potential level of the dummy bit line DBL1. Therefore, the potential level of the dummy bit line DBL2 falls to the L level before the potential level of the dummy bit line DBL1 goes to the L level. Therefore, the bit line potential control of the bit line drive circuit 25b can be invariably finished before the sense amplifier activation timing.

In the semiconductor memory device of this embodiment, since the timing of the test pulse signal TPLS and the sense amplifier activating signal SAE can be caused to be desired timing even under different conditions of a power supply voltage, ambient temperature, and the like, since these signals are generated using a dummy memory cell having the same characteristics as those of a memory cell.

Thus, according to the semiconductor memory device of this embodiment, an erroneous read operation can be reliably elicited with respect to a memory cell in which a failure unstably occurs, and a relationship between a bit line potential during a read operation and a potential of the H level set by a bit line drive circuit can be maintained under various conditions.

Fourth Embodiment

Figure 10:
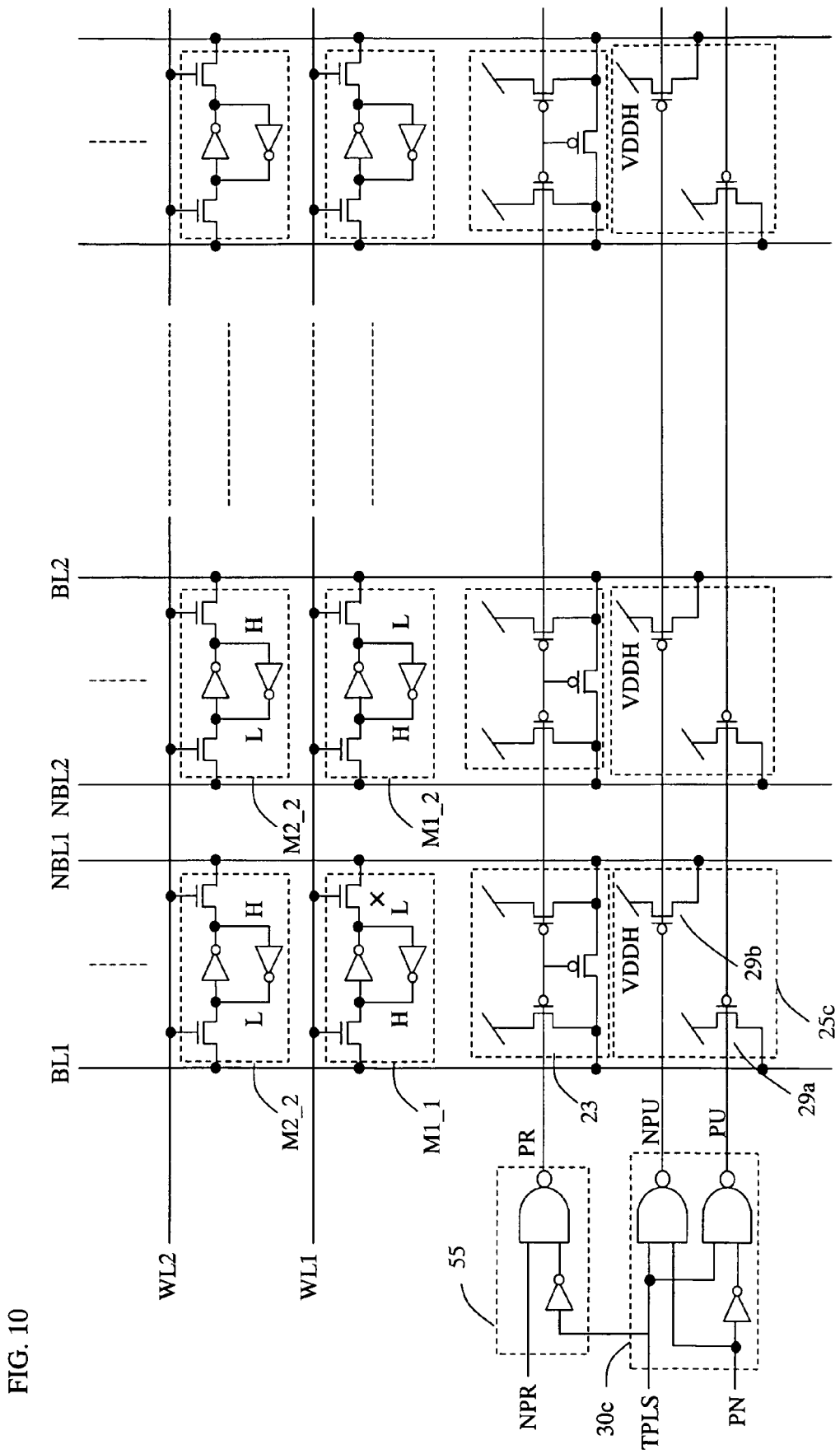
FIG. 10 is a circuit diagram of a semiconductor memory device according to a fourth embodiment of the present invention.

FIG. 10 illustrates a circuit configuration of a semiconductor memory device according to a fourth embodiment of the present invention. In this embodiment, the same parts as those of the semiconductor memory device of the first embodiment are indicated with the same reference numerals and will not be described.

A bit line drive circuit 25c of the semiconductor memory device of this embodiment has a structure different from those of the semiconductor memory devices of the first and second embodiments. The bit line drive circuit 25c comprises pull-up transistors 29a and 29b which are connected between a VDDH potential point of a potential level VDDH and the bit lines BLm and NBLm, respectively, and whose gate electrodes are connected to pull-up control signal lines PU and NPU, respectively. When a test circuit 30c selects one of the pull-up control signal lines PU and NPU, the pull-up transistor 29a or 29b turns to the ON state, so that one of the bit lines BLm and NBLm is electrically connected to the potential point. Here, the potential of the VDDH potential point is higher than the potential VDD which is a typical power supply voltage.

The pull-up control signal lines PU and NPU are driven and controlled by the test circuit 30c to which a test pulse signal TPLS and a data switch signal PN are input. Here, the test pulse signal TPLS is a pulse signal which is in synchronization with rising of the word line WLn during a test operation. The data switch signal PN is a signal that determines which one of the pull-up transistors 29a and 29b is caused to turn to the ON state.

Figure 11:
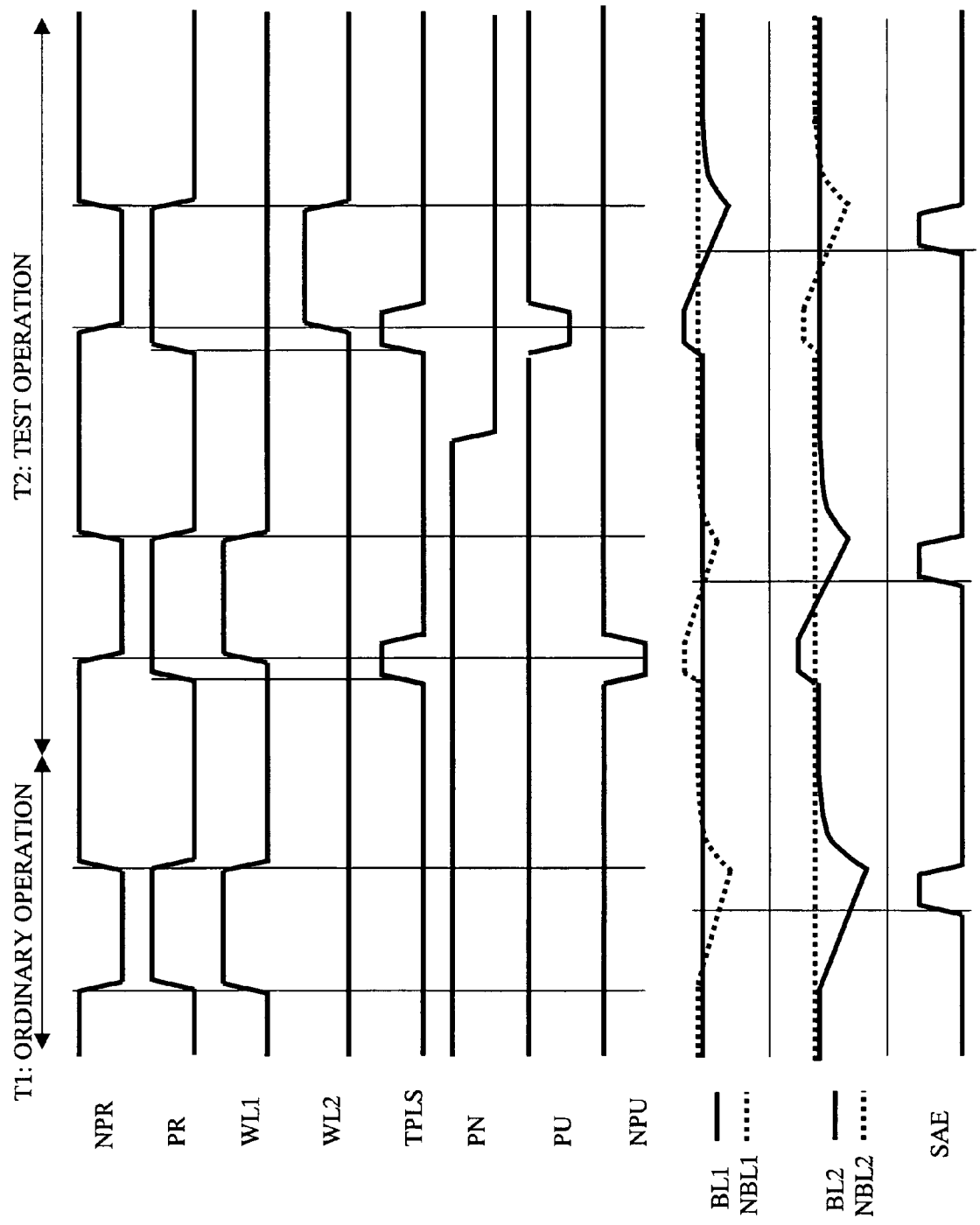
FIG. 11 is a timing chart of a read operation and a test operation of the semiconductor memory device of FIG. 10.
Figure 12:
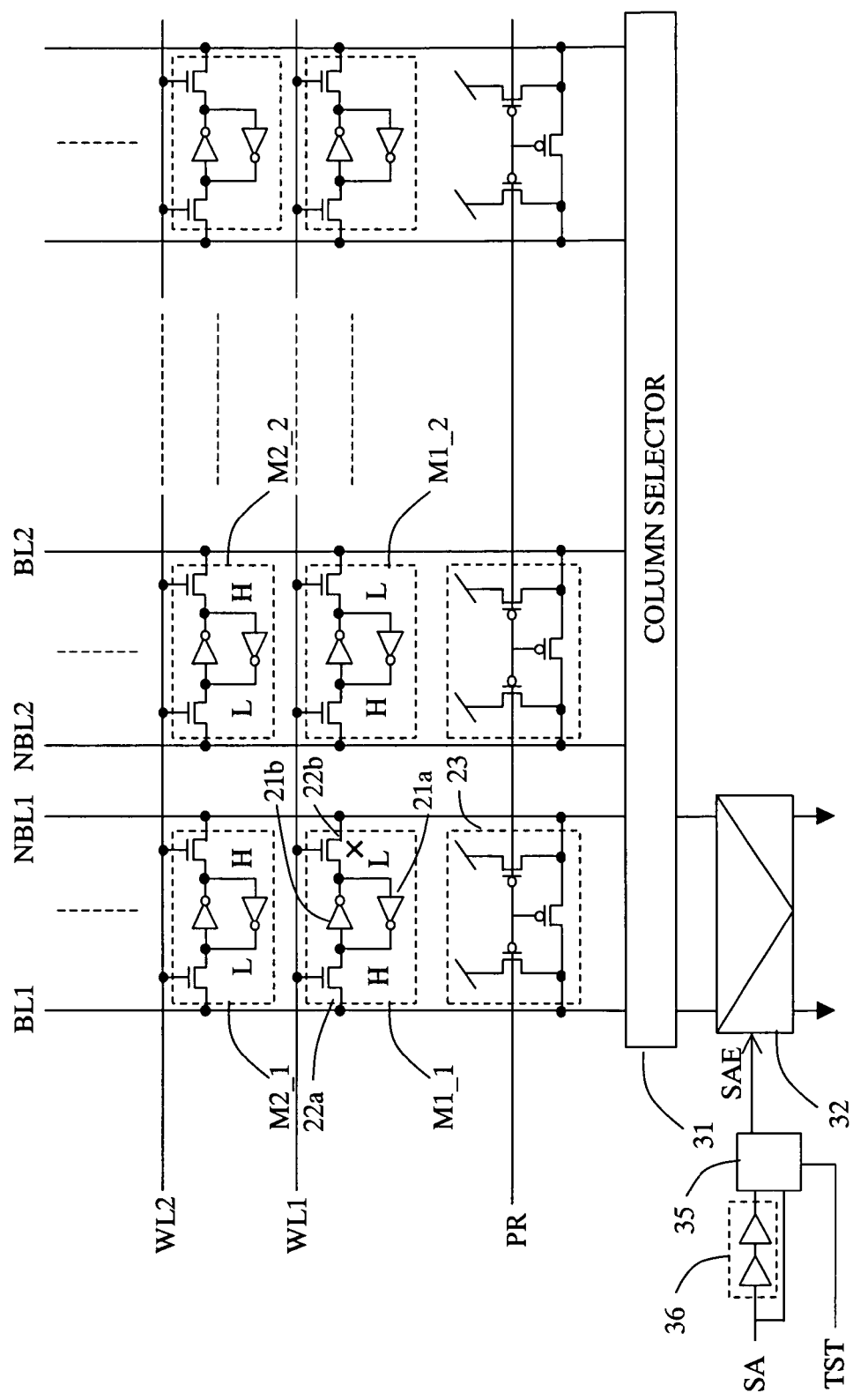
FIG. 12 is a circuit diagram of a conventional semiconductor memory device.
Figure 13:
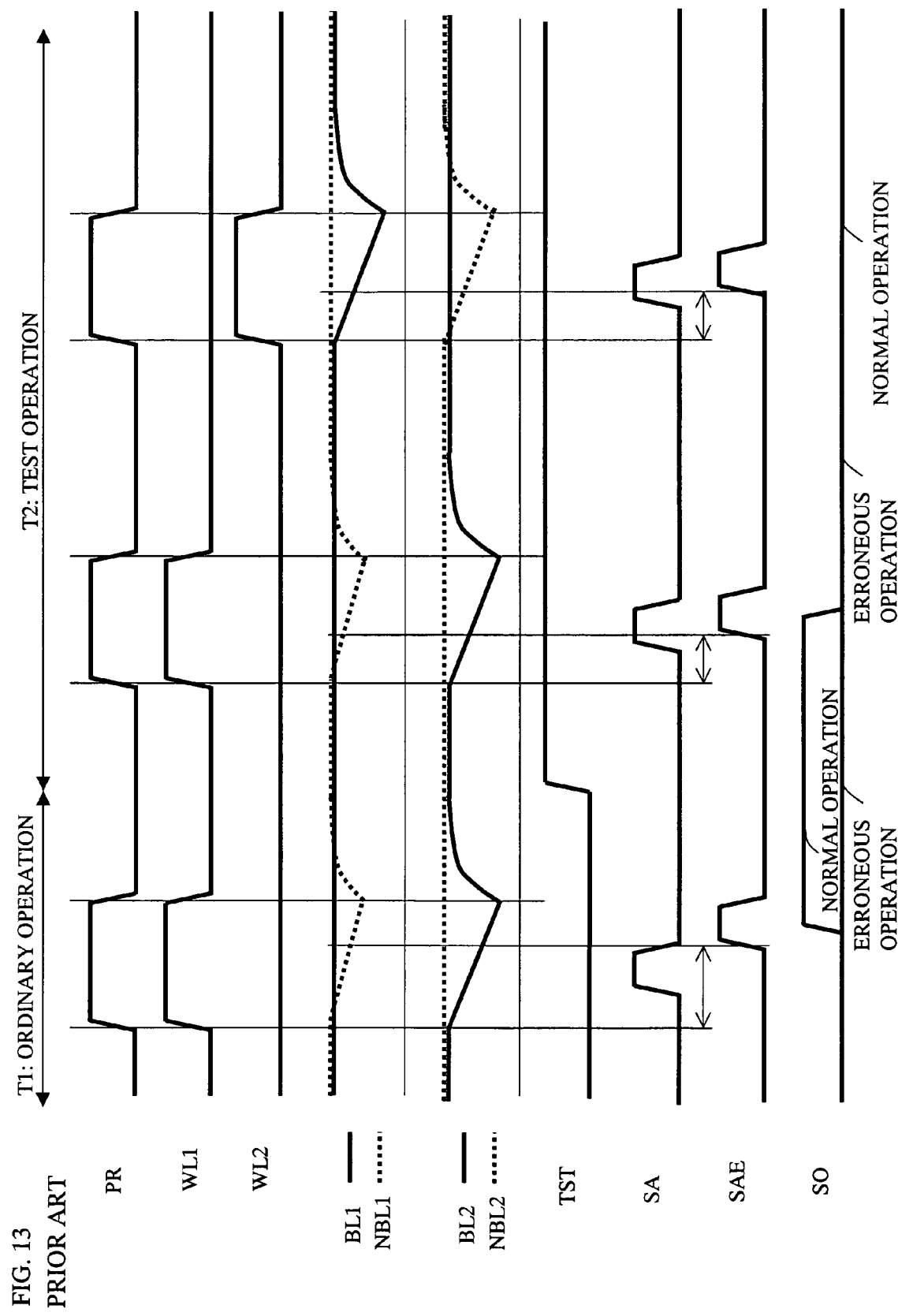
FIG. 13 is a timing chart of a read operation and a test operation of the conventional semiconductor memory device of FIG. 12.

FIG. 11 illustrates a timing chart of a read operation (time period T1) and a test operation (time period T2) of the semiconductor memory device of FIG. 10. Hereinafter, an ordinary read operation and a test operation of a memory cell M1_1 will be described using the timing chart. Here, it is assumed that the access transistor 22b of the memory cell M1_1 has a defect, and therefore, has lower driving capacity than that of other normal access transistors 22b.

A precharge signal line PR is at the L level in the initial state both during the ordinary read operation and during the test operation. In this case, each pair of bit lines BLm and NBLm are precharged to the H level which is the same as the power supply potential VDD. The precharge signal PR is generated by a precharge signal generating circuit 55 to which an inverted precharge signal NPR and the test pulse signal TPLS are input.

During the ordinary read operation, the test pulse signal TPLS is not input to the test circuit 30c, and none of the precharge signal lines PU and NPU is selected.

On the other hand, during the test operation, the following control is performed: when the word line WL1 rises to the H level, so that the L-side memory holding node of the memory cell M1_1 and the bit line NBL1 are brought into conduction, and the potential of the bit line NBL1 falls to the L level, the potential of the bit line NBL1 is temporarily increased. Therefore, the test pulse signal TPLS is input to the test circuit 30c immediately before the word line WL1 is selected. Consequently, the pull-up transistor 29b turns to the ON state only during a time period which is the same as a time period defined by a pulse width of the test pulse signal TPLS. When the pull-up transistor 29b turns to the ON state, the bit line NBL1 is electrically connected to the VDDH potential point, so that the potential of the bit line NBL1 is increased by a predetermined value.

By performing such a control, a potential difference between the pair of bit lines BL1 and NBL1 when the sense amplifier activating signal SAE is input, is smaller than and have the same sign as that during the ordinary read operation, or reverses in sign as compared to the ordinary read operation. Therefore, during the test operation, the potential difference between the pair of bit lines BL1 and NBL1 is invariably smaller than the operating threshold of the sense amplifier 32, or reverses in sign as compared to the normal read operation, thereby making it possible to reliably perform an erroneous read operation.

In the semiconductor memory device of this embodiment, the VDDH potential supplied to the bit line drive circuit can be set by a stable external power supply, thereby making it possible to perform highly accurate potential difference setting.

The semiconductor memory device of the present invention is useful as a semiconductor memory device comprising a test circuit for effectively screening out a device having defective characteristics.

While the invention has been described in detail, the foregoing description is in all aspects illustrative and not restrictive. It is understood that numerous other modifications and variations can be devised without departing from the scope of the invention.

What is claimed is:

1. A semiconductor memory device having a function of testing a read operation, comprising:
 a plurality of memory cells, each of which includes a pair of memory holding nodes, and two access transistors each having a gate electrode connected to the same word line, wherein one of the access transistors connects one of the memory holding nodes to one of a pair of bit lines, the other access transistor connects the other memory holding node to the other bit line, and a memory state of each of the memory cells is determined based on potentials of the memory holding nodes;
 a bit line drive section for independently connecting each of the bit lines included in the pair of bit lines to a predetermined potential level; and
 a sense amplifier for amplifying a potential difference between the pair of bit lines and outputting the amplified potential difference, in accordance with an input of a sense amplifier activating signal, wherein
 when a read operation is tested, the bit line drive section connects at least one of the pair of bit lines to the predetermined potential level upon or immediately before selection of a word line connected to a memory cell to be tested, to reduce the potential difference of the pair of bit lines by a predetermined value,
 the potential difference of the pair of bit lines after being reduced by the predetermined value is smaller than an operating threshold of the sense amplifier, or is reversed in sign as compared to a potential difference of the pair of bit lines in the case where the at least one of the pair of the bit lines is not connected to the predetermined potential level,
 the bit line drive section is provided with respect to the same pair of bit lines as that of the memory cell to be tested, and includes the same transistors as those of the memory cell to be tested, and
 each of the transistors included in the bit line drive section has a corresponding transistor included in the memory cell to be tested, where each of the transistors included in the bit line drive section is the same type and has the same dimensions as its corresponding transistor included in the memory cell to be tested.

2. The semiconductor memory device according to claim 1, wherein a layout of elements constituting the bit line drive section is the same as a layout of elements constituting the memory cell to be tested.

3. A semiconductor memory device having a function of testing a read operation, comprising:
 a plurality of memory cells, each of which includes a pair of memory holding nodes, and two access transistors each having a gate electrode connected to the same word line, wherein one of the access transistors connects one of the memory holding nodes to one of a pair of bit lines, the other access transistor connects the other memory holding node to the other bit line, and a memory state of each of the memory cells is determined based on potentials of the memory holding nodes;
 a bit line drive section for independently connecting each of the bit lines included in the pair of bit lines to a predetermined potential level; and
 a sense amplifier for amplifying a potential difference between the pair of bit lines and outputting the amplified potential difference, in accordance with an input of a sense amplifier activating signal, wherein
 when a read operation is tested, the bit line drive section connects at least one of the pair of bit lines to the predetermined potential level upon or immediately before selection of a word line connected to a memory cell to be tested, to reduce the potential difference of the pair of bit lines by a predetermined value,
 the potential difference of the pair of bit lines after being reduced by the predetermined value is smaller than an operating threshold of the sense amplifier, or is reversed in sign as compared to a potential difference of the pair of bit lines in the case where the at least one of the pair of the bit lines is not connected to the predetermined potential level,
 the bit line drive section is provided with respect to the same pair of bit lines as that of the memory cell to be tested, and includes the same circuit elements as those of the memory cell to be tested,
 the bit line drive section is a memory cell whose memory state is controlled so as to be different from that of the memory cell to be tested, and
 upon or immediately before selection of the word line connected to the memory cell to be tested, a word line connected to the bit line drive section is selected only for a time period less than a time period when the word line connected to the memory cell to be tested is selected.

4. A semiconductor memory device having a function of testing a read operation, comprising:
 a plurality of memory cells, each of which includes a pair of memory holding nodes, and two access transistors each having a gate electrode connected to the same word line, wherein one of the access transistors connects one of the memory holding nodes to one of a pair of bit lines, the other access transistor connects the other memory holding node to the other bit line, and a memory state of each of the memory cells is determined based on potentials of the memory holding nodes;
 a bit line drive section for independently connecting each of the bit lines included in the pair of bit lines to a predetermined potential level; and
 a sense amplifier for amplifying a potential difference between the pair of bit lines and outputting the amplified potential difference, in accordance with an input of a sense amplifier activating signal, wherein when a read operation is tested, the bit line drive section connects at least one of the pair of bit lines to the predetermined potential level upon or immediately before selection of a word line connected to a memory cell to be tested, to reduce the potential difference of the pair of bit lines by a predetermined value, and the potential difference of the pair of bit lines after being reduced by the predetermined value is smaller than an operating threshold of the sense amplifier, or is reversed in sign as compared to a potential difference of the pair of bit lines in the case where the at least one of the pair of the bit lines is not connected to the predetermined potential level, the bit line drive section includes:
- a potential supply point for supplying a predetermined potential; and
- two potential adjusting transistors having gate electrodes connected to two different control lines, respectively, one of the potential adjusting transistor connecting one of the pair of bit lines to the potential supply point, and the other potential adjusting transistor connecting the other bit lines to the potential supply point, and upon or immediately before selection of the word line to which the memory cell to be tested is connected, one of the control lines is selected only for a time period less than a time period during which the word line connected to a memory cell to be tested is selected.

5. The semiconductor memory device according to claim 4, wherein the potential supply point supplies a potential having a magnitude which decreases a potential of a bit line connected to a high potential-side memory holding node.

6. The semiconductor memory device according to claim 4, wherein the potential supply point supplies a potential having a magnitude which increases a potential of a bit line connected to a low potential-side memory holding node.

7. A semiconductor memory device having a function of testing a read operation, comprising:
- a plurality of memory cells, each of which includes a pair of memory holding nodes, and two access transistors each having a gate electrode connected to the same word line, wherein one of the access transistors connects one of the memory holding nodes to one of a pair of bit lines, the other access transistor connects the other memory holding node to the other bit line, and a memory state of each of the memory cells is determined based on potentials of the memory holding nodes;
- a bit line drive section for independently connecting each of the bit lines included in the pair of bit lines to a predetermined potential level;
- a sense amplifier for amplifying a potential difference between the pair of bit lines and outputting the amplified potential difference, in accordance with an input of a sense amplifier activating signal;
- a plurality of replica memory cells provided with respect to a pair of dummy bit lines;
- a pulse generating circuit for generating a control signal for the bit line drive circuit based on a potential level of one of the pair of dummy bit lines; and
- a sense amplifier activating signal generating circuit for generating a drive signal for the sense amplifier based on a potential level of the other of the pair of dummy bit lines, wherein when a read operation is tested, the bit line drive section connects at least one of the pair of bit lines to the predetermined potential level upon or immediately before selection of a word line connected to a memory cell to be tested, to reduce the potential difference of the pair of bit lines by a predetermined value, the potential difference of the pair of bit lines after being reduced by the predetermined value is smaller than an operating threshold of the sense amplifier, or is reversed in sign as compared to a potential difference of the pair of bit lines in the case where the at least one of the pair of the bit lines is not connected to the predetermined potential level, and the number of replica memory cells for driving the one dummy bit line is larger than the number of replica memory cells for driving the other dummy bit line.

8. A semiconductor memory device having a function of testing a read operation, comprising;
- a plurality of memory cells, each of which includes a pair of memory holding nodes, and two access transistors each having a gate electrode connected to the same word line, wherein one of the access transistors connects one of the memory holding nodes to one of a pair of bit lines, the other access transistor connects the other memory holding node to the other bit line, and a memory state of each of the memory cells is determined based on potentials of the memory holding nodes;
- a bit line drive section for independently connecting each of the bit lines included in the pair of bit lines to a predetermined potential level; and
- a sense amplifier for amplifying a potential difference between the pair of bit lines and outputting the amplified potential difference, in accordance with an input of a sense amplifier activating signal, wherein when a read operation is tested, the bit line drive section connects at least one of the pair of bit lines to the predetermined potential level upon or immediately before selection of a word line connected to a memory cell to be tested, to reduce the potential difference of the pair of bit lines by a predetermined value, the potential difference of the pair of bit lines after being reduced by the predetermined value is smaller than an operating threshold of the sense amplifier, or is reversed in sign as compared to a potential difference of the pair of bit lines in the case where the at least one of the pair of the bit lines is not connected to the predetermined potential level, the bit line drive section is provided with respect to the same pair of bit lines as that of the memory cell to be tested, and consists of the same transistors as those of the memory cell to be tested, and each of the transistors consisting the bit line drive section has a corresponding transistor included in the memory cell to be tested, where each of the transistors consisting the bit line drive section is the same type and has the same dimensions as its corresponding transistor included in the memory cell to be tested.

9. The semiconductor memory device according to claim 8, wherein a layout of elements constituting the bit line drive section is the same as a layout of elements constituting the memory cell to be tested.

* * * * *